United States Patent [19]

Yamamoto et al.

[11] Patent Number: 5,630,214
[45] Date of Patent: May 13, 1997

[54] WIDE-BAND RECEIVING APPARATUS WITH LOCAL OSCILLATING CIRCUIT

[75] Inventors: Akio Yamamoto, Hiratsuka; Masaki Noda, Chigasaki; Toshio Nagashima, Yokohama; Masatoshi Oga, Fujisawa, all of Japan

[73] Assignee: Hitachi, Ltd., Tokyo, Japan

[21] Appl. No.: 397,735

[22] Filed: Mar. 2, 1995

Related U.S. Application Data

[63] Continuation of Ser. No. 882,276, May 13, 1992, abandoned.

[51] Int. Cl.$^6$ .................................................. H04B 1/18
[52] U.S. Cl. .............................. 455/190.1; 455/180.1; 455/196.1; 455/208; 455/258
[58] Field of Search ........................ 455/176.1, 189.1, 455/190.1, 197.3, 196.1, 208, 209, 216, 255, 256, 258, 265, 315, 316, 318, 319

[56] References Cited

U.S. PATENT DOCUMENTS

| | | | |
|---|---|---|---|
| 3,931,578 | 1/1976 | Gittinger | 455/190.1 |
| 4,087,628 | 5/1978 | Sanders et al. | 455/208 X |
| 4,218,773 | 8/1980 | Imamura | 455/189.1 X |
| 4,373,115 | 2/1983 | Kahn | 455/126 |
| 4,402,089 | 8/1983 | Knight et al. | 455/188.1 X |
| 4,512,035 | 4/1985 | Victor et al. | 455/316 |
| 4,817,197 | 3/1989 | Shimizu | 455/314 |
| 5,003,620 | 3/1991 | Tenjin | 455/189.1 |
| 5,014,349 | 5/1991 | Kubo et al. | 455/189.1 |
| 5,046,133 | 9/1991 | Watanabe et al. | 455/138 |

OTHER PUBLICATIONS

"Preliminary Test Results of Tuner for Optical Video Distribution System", Published in National Conference (1991), B-917, The Institute of Electronic Information and Communication Engineers in Japan.

"Study on an Optical Image Distributing System", Published in National Conference, (1990), B-714, The Institute of Electronic Information and Communication Engineers in Japan.

*Primary Examiner*—Edward F. Urban
*Attorney, Agent, or Firm*—Antonelli, Terry, Stout & Kraus, LLP

[57] ABSTRACT

A wide-band receiving apparatus used in an FM-FDM type optical image distributing system for transmitting multiwave and multiple TV signals comprises a circuit for receiving a wide-band input signal containing modified RF signals of two or more different frequency bands and separating the RF signals by the bands; respectively, a first circuit for selecting one of the separated RF signals; a local oscillating circuit for generating a first oscillating signal of a fundamental frequency which is determined based on the frequency range of the selected RF signal; a circuit for producing at least one oscillating signal of a frequency having a predetermined ratio to the fundamental frequency; a second selecting circuit for selecting one of the first oscillating signal and at least one second oscillating signal; a circuit for mixing the selected RF signal with the selected oscillating signal thereby producing an intermediate-frequency signal; and a circuit for demodulating the intermediate-frequency signal.

1 Claim, 8 Drawing Sheets

WIDE-BAND RECEIVING APPARATUS WITH LOCAL OSCILLATING CIRCUIT

This application is a continuation of Ser. No.07/882,276, filed May 13, 1992, now abandoned.

BACKGROUND OF THE INVENTION

1. Field of the Invention

The present invention relates to a wide-band receiving apparatus, and more particularly to a wide-band receiving apparatus used in an FM(Frequency Modulaton)-FDM (Frequency Division Multiplex) type optical image distributing system for transmitting multi-wave and multiple TV signals.

2. Description of the Related Art

An FM-FDM type optical image distributing system is currently more greatly studied than an FDM type distributing system, because the former system has lower noise and lower distortion than the latter system and can transmit signals on a multi-channel basis. Most of the current research, however, concerns optimization of an optical modulating and demodulating system or an optical transmitting system as described in "Study on an optical image distributing system" published in the National Conference Autumn 1990, B-714, the Institute of Electronic Information and Communication Engineers in Japan.

On the other hand, a wide-band receiving front-end apparatus is disclosed in "Trial Manufacture of an Optical Image Distributing Tuner" published in the National Conference, spring 1991, B-917, the Institute of Electronic Information and Communication Engineers in Japan. This front-end apparatus operates to select a desired signal from an optical demodulating signal ranging from 57.54 MHz to 1668 MHz and demodulate the selected signal.

Each of the foregoing wide-band receiving apparatuses needs a front-end device having two mixers and a local oscillating circuit. Hence, it is disadvantageous in that the apparatus is complicated in arrangement and is expensive.

SUMMARY OF THE INVENTION

It is an object of the present invention to provide a wide-band receiving apparatus used in an FM-FDM type optical image distributing system in which the apparatus includes a small-sized and simply-arranged front-end device for selectively receiving a desired signal from a demodulating signal widely ranging from 20 to 1700 MHz or 500 to 2300 MHz.

According to the present invention, the wide-band receiving apparatus includes a circuit for receiving a wide-band input signal containing RF signals on two or more different bands, respectively, and separating the RF signals from each other, a circuit for selecting one of the separated RF signals, a local oscillating circuit for generating an output of a predetermined fundamental frequency, a circuit for producing at least two local oscillating signals having different frequency characteristics from one another, and a circuit for mixing the selected one of the RF signals with a selected one of the local oscillating signals thereby producing a signal of an intermediate frequency.

According to one aspect of the present invention, the local oscillating signals having frequency characteristics differing from one another contain a signal of the fundamental frequency generated in the local oscillating circuit and at least a signal of a frequency having a predetermined ratio with the fundamental frequency, the local oscillating signal of a frequency corresponding to the frequency of the selected RF signal is selected, and the selected local oscillating signal is mixed with the selected RF signal thereby producing the intermediate frequency signal.

The circuit for separating the RF signals of two or more different bands may be composed of simple LC filters such as low-pass, high-pass, and band-pass filters. The separated RF signals of respective bands are amplified by respective RF amplifying circuits and one of the RF signals of a desired band is selected by selecting one of the amplifying circuits, which satisfactorily suppresses undesired signals other than the selected band signal. By properly selecting the bandwidth of each separated RF signal, it is possible to satisfactorily suppress an image signal generated in a process for generating the intermediate-frequency signal. Further, by using, as the local oscillating signals having different frequency characteristics, the signal of the fundamental frequency generated in the local oscillating circuit, a signal of double the fundamental frequency and/or a signal of half the fundamental frequency, it is possible to obtain a wide-band receiving apparatus having a simple front-end device without using two or more local oscillating circuits.

DESCRIPTION OF THE PREFERRED EMBODIMENTS

Figure 1:
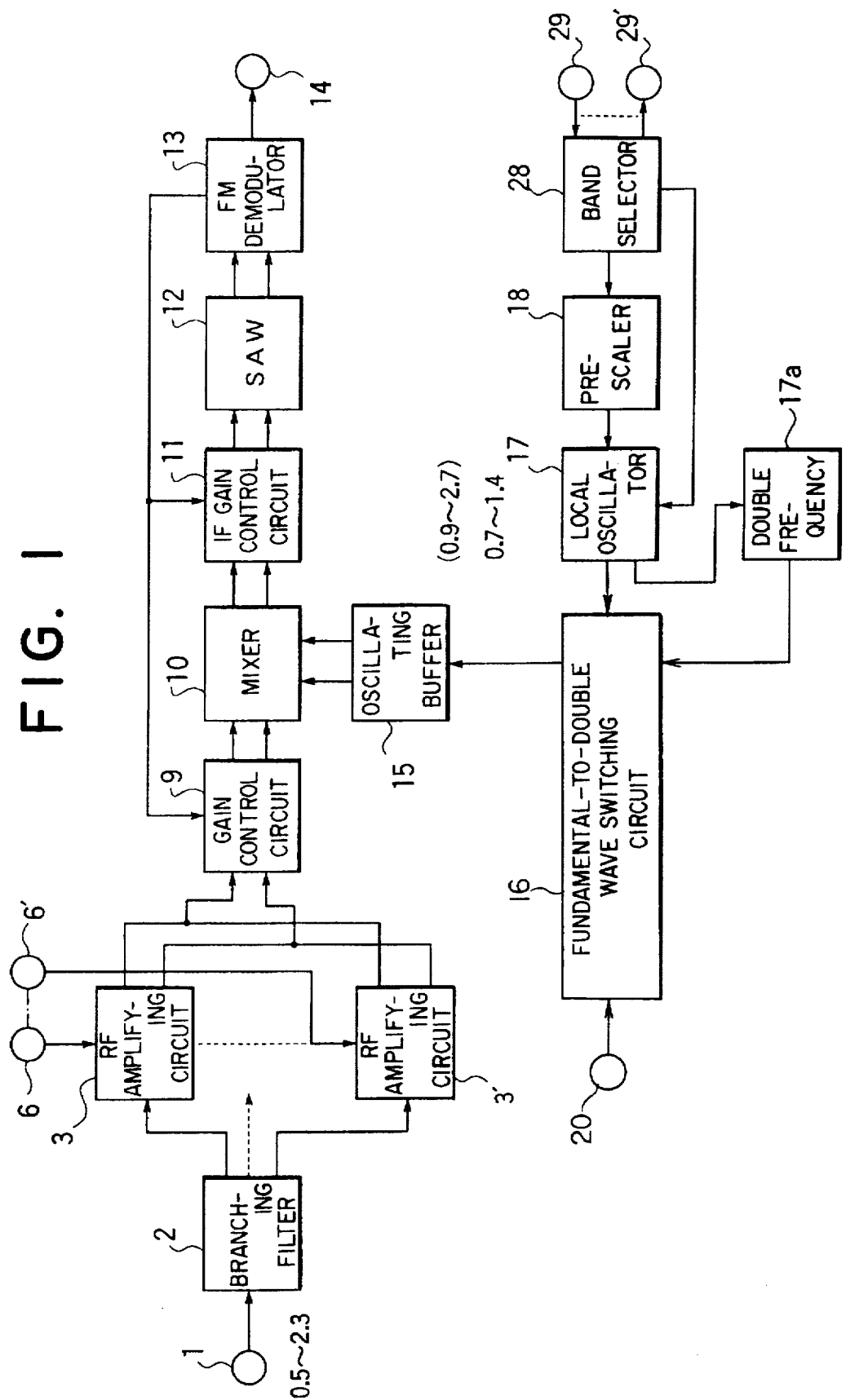
FIG. 1 is a block diagram showing a receiving apparatus according to a first embodiment of the present invention.

Herein, the present invention will be described in detail referring to the drawings.

FIG. 1 is a block diagram showing a front-end section of a receiving apparatus used in a wide-band signal transmitting system such as an optical image distributing system according to a first embodiment of the present invention.

As shown, a wide-band RF signal (ranging from 0.5 to 2.3 GHz, for example) is input at a terminal 1. Then, the RF signal is divided into two or more RF signals of respective different bands by a branching filter. The divided signals are sent to the RF amplifying circuits 3 to 3', respectively. One of the RF amplifying circuits is selected for a frequency band of a desired channel in response to an active one of channel-selecting signals input at the terminals 6 to 6'. The other RF amplifying circuits are made inoperative. From the two or more output bands of the branching filter 2, one band is selected. As an example, assuming that the branching filter 2 has three outputs, the band widths of the three outputs are set to 0.4 to 1.2, 1.1 to 1.8, and 1.6 to 2.4 GHz. This band width is set to satisfactorily suppress the generation of superfluous waves containing an image signal when converting the input signal into an intermediate frequency signal.

Each of the RF amplifying circuits 3 to 3' is a differential amplifier and produces a differential output including two signals having substantially the same amplitude and a 180° phase difference from each other. The differential output of one of the amplifying circuits is applied to an RF gain control circuit 9. The signal is sent, after controlled for its gain by the circuit 9, to a mixer 10. The mixer 10 serves to mix the gain-controlled signal with an oscillating signal input from an oscillating buffer 15 and produce an intermediate-frequency signal of, for example, 402 MHz.

Next, the description will be made of the arrangement of the oscillating circuit. For example, when a RF input signal of 0.5 to 2.3 GHz is converted into an intermediate frequency signal of 402 MHz, the oscillating circuit needs a variable frequency range of 0.9 to 2.7 GHz or more. However, it is difficult to stably obtain such a wide oscillating band directly from an oscillator. Hence, this embodiment is arranged such that the oscillating signal produced by the local oscillator 17 is supplied directly as a fundamental wave or supplied after being converted to a double frequency wave having a frequency double that of the fundamental wave so that one of the fundamental wave and the half frequency signal is selectively used depending on the frequency band of the received RF signal thereby making it possible to cover a wide oscillating frequency range by one oscillator.

For example, assuming that the variable oscillating frequency of the local oscillator 17 is in a range of from 0.7 to 1.4 GHz, when the input RF signal is in a range of 0.5 to 1.0 GHz, the fundamental wave is used. When the input RF signal is in a range of 1.0 to 2.3 GHz, the double frequency wave of 1.4 to 2.8 GHz is used. To this end, the local oscillator 17 is connected to a circuit 17a for doubling the fundamental frequency and a switching circuit 16 for selecting one of the fundamental wave and the double frequency wave. The waves are selectively used in response to a switching signal applied to a terminal 20. The switching signal is effective to select one of the fundamental wave and the double frequency wave depending on the band of the RF amplifying frequency selected by the active one of the channel-selecting signals applied to the terminals 6 to 6'.

The fundamental wave or the double frequency wave selected by the switching circuit 16 is input to the mixer 10 through the oscillating buffer circuit 15.

The frequency of an oscillating signal sent from the local oscillator (VCO) 17 is divided into 1/N (N is a predetermined integer such as 2, 128, or 256). Then, the divided-frequency signal is applied to a band selector 28. The band selector 28 serves to control the oscillated frequency of the local oscillator 17 by using the divided-frequency signal and the band-selecting signal input to the band-selector 28 from the terminals 29 to 29' interlocked with the channel-selecting signals.

Figure 8:
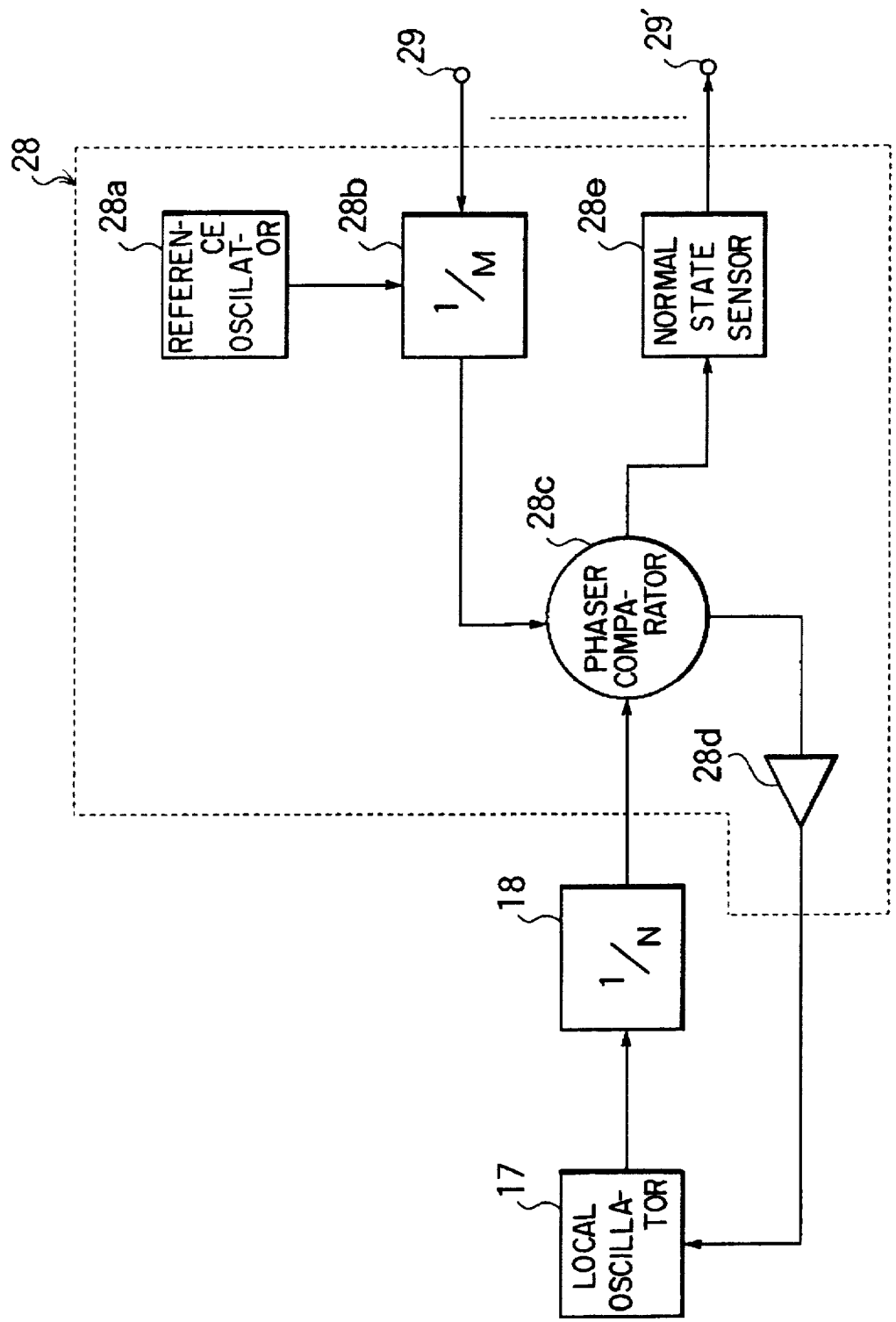
FIG. 8 is a block diagram showing a band selector.

One concrete arrangement of the band selector 28 is illustrated in FIG. 8. The band selector 28 is arranged to have a reference oscillator 28a for generating a signal of predetermined constant frequency, a frequency divider 28b for dividing the constant frequency into 1/M, a phase comparator 28c, an amplifier 28d, and a normal state sensor 28e. The value of M in the frequency divider 28b varies depending on the band-selecting signal input at the terminal 29. The phase comparator 28c serves to compare the signal sent from the pre-scaler 18 in phase with the signal from the frequency divider 28b and supply an error signal derived from the comparison to the local oscillator 17 as a control signal for controlling the oscillator 17 so that the frequency of the signal generated by the oscillator 17 becomes equal to the frequency determined by the band-selecting signal. The normal state sensor 28e supplies a select-band signal from its output 29 when both the signals coincide in phase with each other.

Next, the intermediate-frequency (IF) signal output from the mixer 10 is amplified by the IF gain control circuit 11 at a controlled gain and then applied to the SAW filter 12 in which the frequency-band of the signal is limited The resulting signal is input to the FM demodulator 13 in which the signal is FM demodulated. The demodulated signal appears at a terminal 14 as a base-band signal. The FM demodulator 13 supplies a difference signal between a level of its output signal and a predetermined level to control the gains of the RF gain control circuit and the IF gain control circuit, so that the output of the demodulator 13 is at the predetermined level.

This embodiment is arranged such that the branching filter is located at the input stage of the RF signal and the output signal band of the branching filter is selected by switching the RF amplifying circuits. This arrangement is effective to obtain a simple input circuit having a high capability for suppressing superfluous band signals. Further, this embodiment is also effective for obtaining an oscillation signal of a wider frequency range by using a local oscillator having a relatively narrow variable frequency range since both of the fundamental wave and a double frequency wave thereof are produced by the local oscillator and one of them is selectively used.

This embodiment may be arranged such that the 25. RF amplifying circuits 3 to 3' are made in an integrated circuit by using GaAs MES FETs which are excellent in high frequency and anti-distortion characteristics and the RF gain control circuit 9, the mixer 10, the oscillating buffer 15, the fundamental-to-double wave switching circuit 16 and the IF gain control circuit are integrated in one IC. This arrangement is effective to obtain an integrated front-end device which is excellent in high frequency and anti-distortion characteristics.

Figure 2:
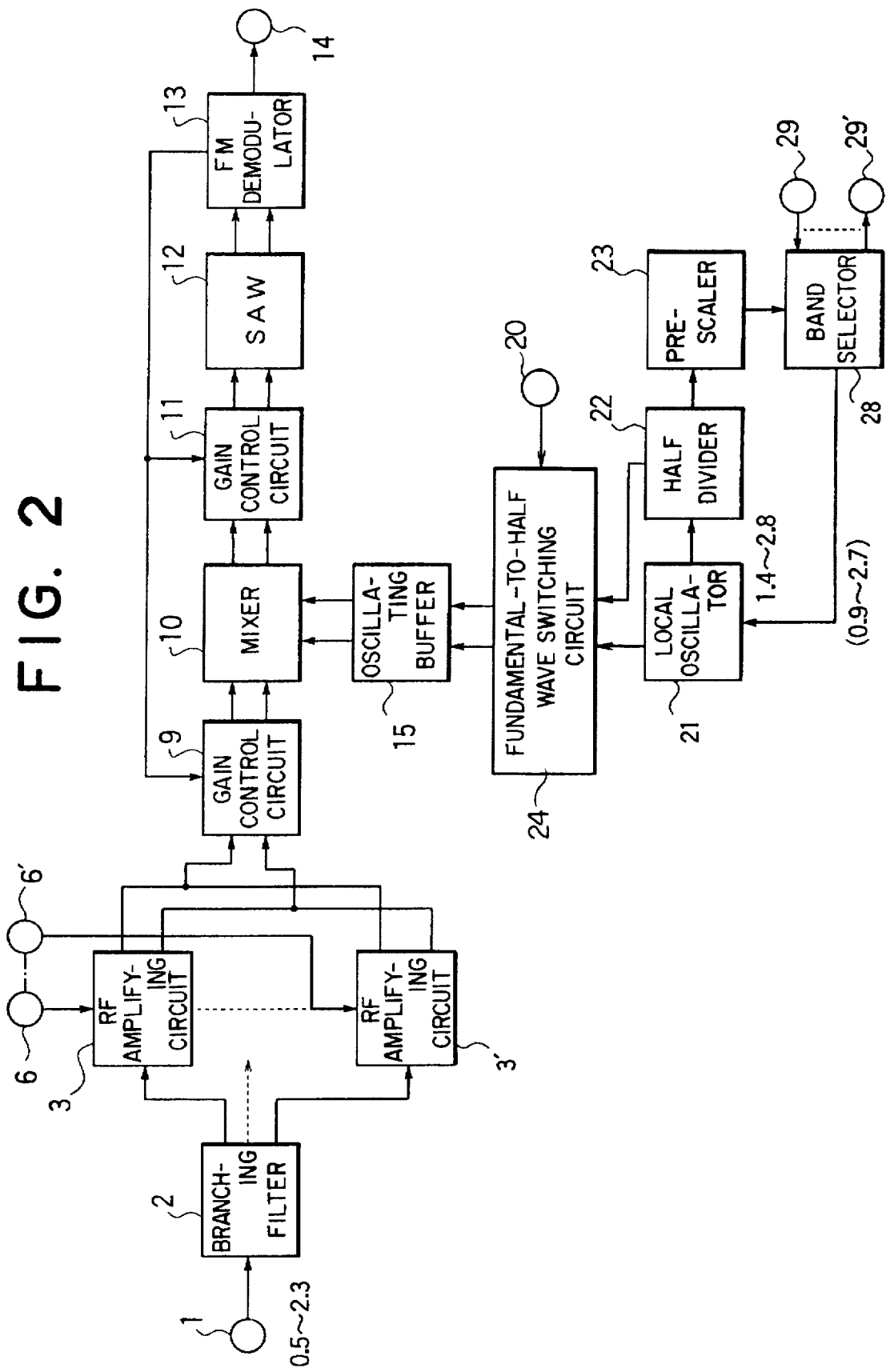
FIG. 2 is a block diagram showing a receiving apparatus according to a second embodiment of the present invention.

FIG. 2 is a block diagram showing a receiving apparatus according to a second embodiment of the present invention. The different aspect of the second embodiment from the first embodiment is only an arrangement of the oscillator. Hence, the following description will be directed to the arrangement of the oscillator and the explanation of the remaining parts will be omitted.

For example, when an RF input signal of a frequency in a range of 0.5 to 2.3 GHz is converted into an intermediate-frequency (IF) signal of 402 MHz, the oscillator needs a variable frequency range of 0.9 to 2.7 GHz or more. However, it is quite difficult to stably obtain such a wide oscillating band directly from an oscillator. Hence, the second embodiment is arranged such that the oscillating signal produced by the local oscillator 21 is supplied directly as a fundamental wave or supplied after being converted to a half frequency wave having a frequency half that of the fundamental wave so that one of the fundamental wave and the half frequency wave is selectively used depending on the frequency band of the received RF signal thereby making it possible to cover a wide oscillating frequency range by one oscillator. For example, assuming that the oscillating frequency of the local oscillator 17 is in a range of 1.4 to 2.8 GHz, when the input RF signal has a frequency in a range of 0.5 to 1.0 GHz, the half frequency wave (0.7 to 1.4 GHz) is used. When the input RF signal has a frequency in a range of 1.0 to 2.3 GHz, the fundamental wave (1.4 to 2.8 GHz) is used.

In the illustrative embodiment, the output of the local oscillator 21 is input to a frequency half-divider 22. A fundamental-to-half wave switching circuit 24 serves to select one of the outputs from the local oscillator 21 and the frequency half divider 22 in response to the switching voltage applied to the terminal 25. The fundamental wave or the half frequency wave outputted from the switching circuit 24 is input to a mixer 10 through an oscillating buffer 15. The oscillating signal from the frequency half-divider 22 is input to a pre-scaler 23 for dividing the signal. The succeeding operation is the same as that of the first embodiment and hence will not be described.

This second embodiment can achieve the same effect as the first embodiment.

Figure 3:
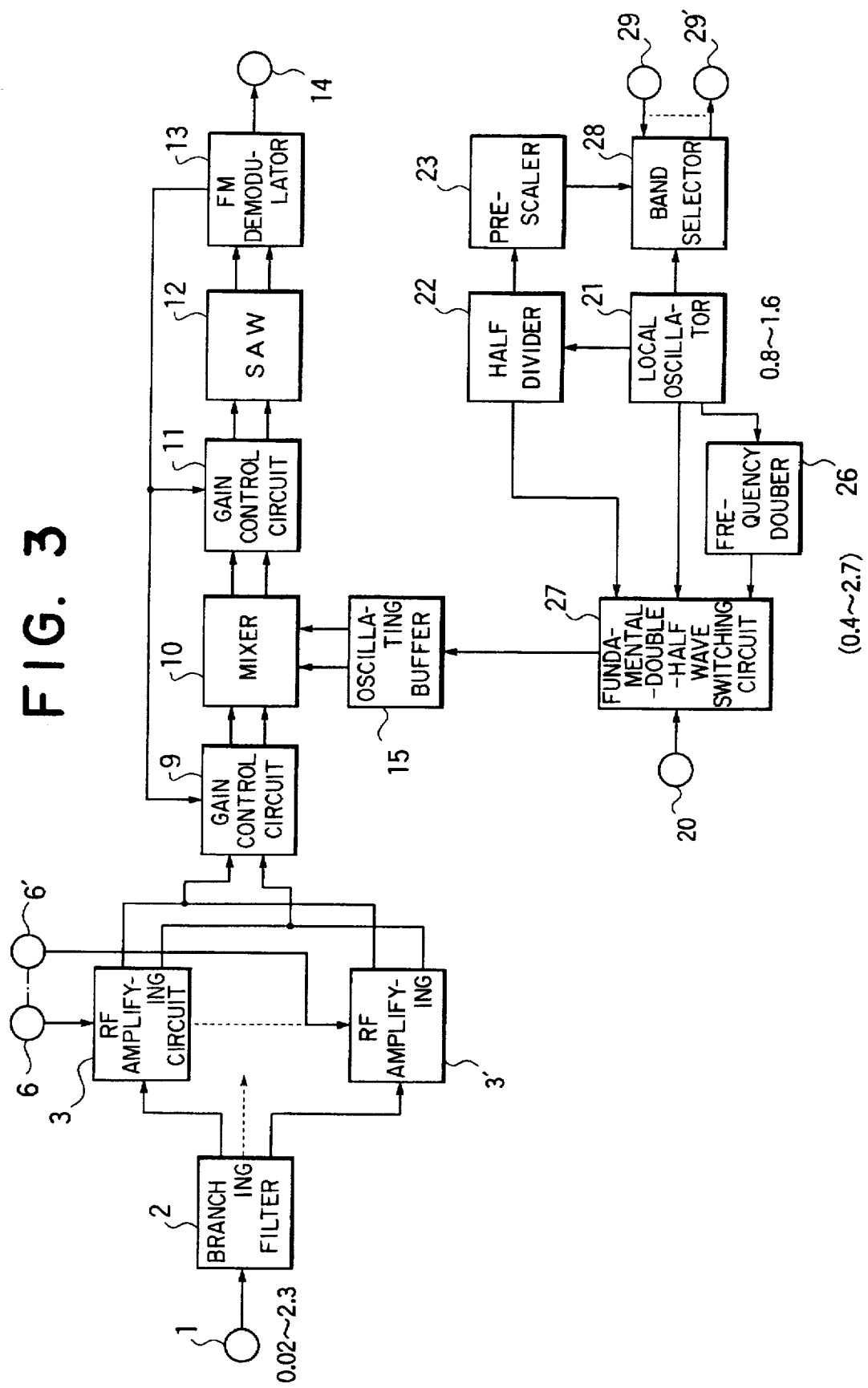
FIG. 3 is a block diagram showing a receiving apparatus according to a third embodiment of the present invention.

FIG. 3 is a block diagram showing a receiving apparatus according to a third embodiment of the present invention. The different aspect of the third embodiment from the first and the second embodiments is only an arrangement of an oscillator. Hence, the following description is directed to the arrangement of the oscillator. The remaining parts will not be described.

For example, when an RF input signal of a frequency in a range of 0.02 to 2.3 GHz is converted into an intermediate-frequency (IF) signal of 402 MHz, the oscillator needs a variable frequency range of 0.4 to 2.7 GHz or more. However, it is difficult to stably obtain such a wide oscillating band directly from an oscillator. Hence, the third embodiment is arranged such that the oscillating signal produced by the local oscillator 21 is supplied directly as a fundamental wave or supplied after being converted to a half frequency wave having a half frequency half that of the fundamental wave or a double frequency wave having a double frequency double that of the fundamental wave so that one of the fundamental wave, the half frequency wave and the double frequency wave is selectively used depending on the frequency band of the received RF signal thereby making it possible to cover a wide oscillating frequency range by one oscillator. For example, assuming that the oscillating frequency of the local oscillator 21 is set to 0.8 to 1.6 GHz, when the input RF signal has a frequency in a range of 0.02 to 0.4 GHz, the half frequency wave (0.4 to 0.8 GHz) is used. When the input RF signal has a frequency in a range of 0.4 to 1.2 GHz, the fundamental wave is used. When the input RF signal has a frequency in a range of 1.2 to 2.3 GHz, the double frequency wave (1.6 to 3.2 GHz) is used.

In the embodiment, a fundamental-double-half wave switching circuit 27 is located next to the local oscillator as shown in FIG. 3. The switching circuit 27 operates to select one of the fundamental wave sent from the local oscillator 21, the double frequency wave sent from a frequency doubler 26 and the half frequency wave sent from the frequency half divider 22 in response to a switching signal applied to a terminal 20. The oscillating signal (fundamental wave, double or half frequency wave) output from the switching circuit 27 is input to the mixer 10 through the oscillating buffer 15.

The frequency of oscillating signal from the oscillator 21 is divided by a half divider 22 and a pre-scaler 23. The succeeding operation is the same as that of the first embodiment and hence will not be described.

This third embodiment is effective to receive a wider band RF signal than any of the first and the second embodiments, while achieving the same effect as that of the first and the second embodiments.

Figure 4:
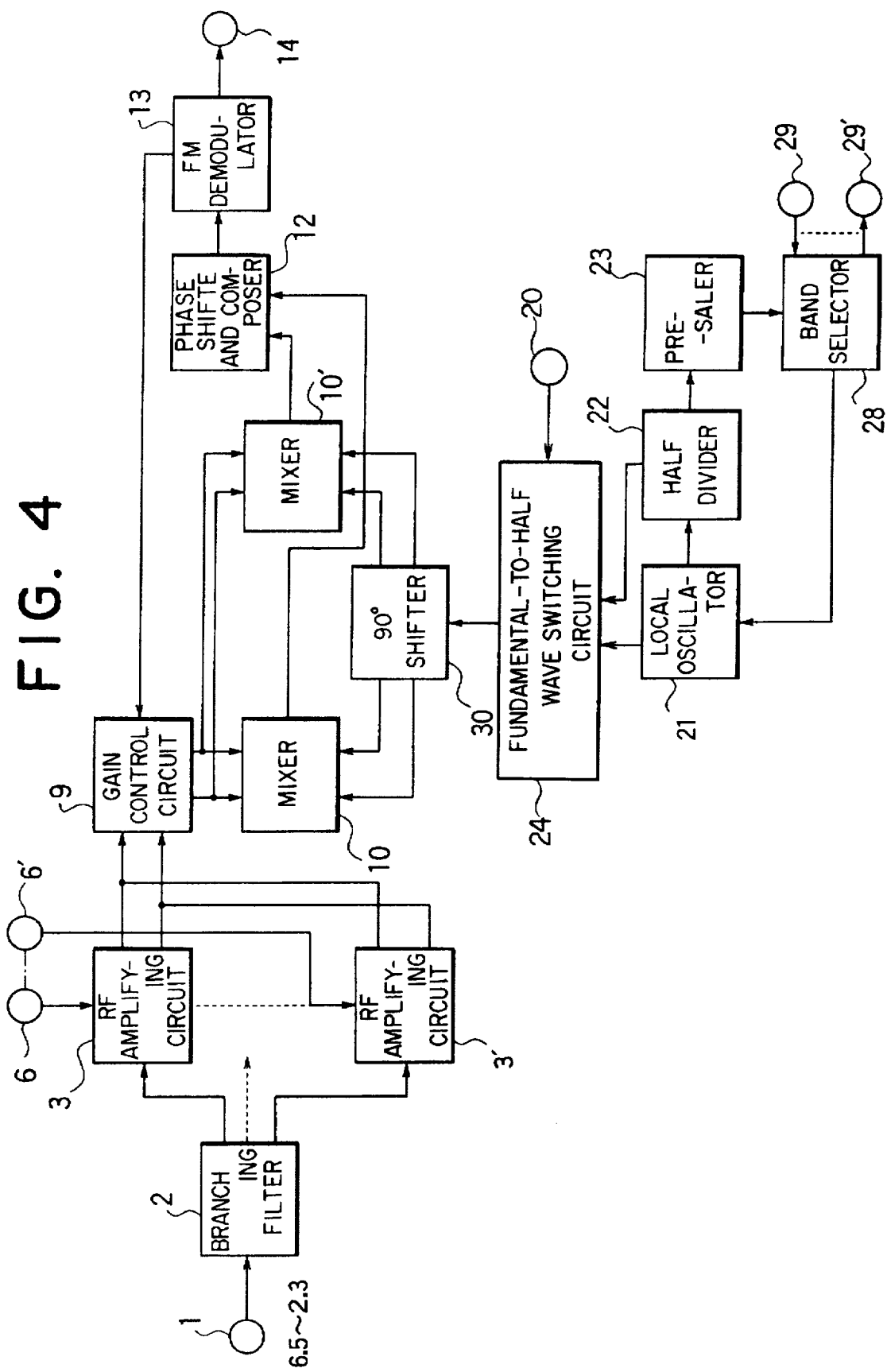
FIG. 4 is a block diagram showing a receiving apparatus according to a fourth embodiment of the present invention.

FIG. 4 is a block diagram showing a receiving apparatus according to a fourth embodiment of the present invention.

As shown, like the foregoing embodiments, the RF signal (for example, 0.5 to 2.3 GHz) input is branched into two or more bands through the branching filter 2. The branched band signals are input to the RF amplifying circuits 3 to 3'. One of the RF amplifying circuits 3 to 3' is selected in response to an active one of the signals input to terminals 6 to 6'. The other RF circuits are made invalid. Thus one band is selected from the two or more output bands of the branching filter 2. As an example, assuming that the branching filter 2 has three outputs, the three output band widths are set to 0.4 to 1.2, 1.1 to 1.8 and 1.6 to 2.4 GHz, respectively so that the branching filter may suppress the superfluous waves such as an image signal.

One of the RF amplifying circuits 3 to 3' produces a differential output which is applied to an RF gain control circuit 9.

Then, the description will be directed to an image-canceling mixer, which is a feature of this embodiment. The image canceling mixer is arranged to have two mixer circuits 10, 10', a wide-band 90° shifter 30 and a phase synthesizer 12. The receiving signal is sent to the gain control circuit 9 in which the gain of the signal is controlled. Then, the gain-controlled signal is separated into two ways, which are input to the mixer circuits 10 and 10' respectively. On the other hand, one of the oscillating signal i.e. a fundamental wave, sent from a local oscillator 21 and a half frequency wave produced by a half divider 22 and having a half frequency of the fundamental wave is selected by a fundamental-to-half wave switching circuit 24. The selected signal is divided by the 90° shifter 30 into two signals having a phase difference of 90°. The two signals are input to the mixer circuits 10 and 10'. Each of the mixer circuits 10 and 10' operates to mix the receiving signal supplied from the gain-control circuit 9 and the output of the phase shifter 30 and produce an intermediate frequency (IF) signal. The IF signals produced by the mixer circuits 10 and 10' are applied to a phase shift and composer 12, which shifts the phase of one of the IF signals by 90° and composes the phase-shifted IF signal with the other IF signal to eliminate the image signal thereby producing only a desired signal which is applied to the FM demodulator 13.

The oscillating signal sent from the half divider 22 is further divided by a pre-scaler 23. The resulting signal is input to a band selector 28. Like the first and the second embodiments, a band-selecting signal is applied from terminals 29 to 29' to the band selector 28. The band selector 28 serves to control the oscillation frequency of the local oscillator 21, based on a signal indicative of the phase difference between the frequency-divided signal and the fundamental wave frequency-divided according to the band-selecting signal. A band-select detection signal is outputted at the terminal 29'.

Next, an FM demodulator 13 serves to FM-demodulate the signal applied thereto and output the resulting signal as a base-band signal at the terminal 14. The gain of the RF gain control circuit is controlled by the output of the FM demodulator 13 so that the output level of the FM demodulator 13 is kept at a predetermined level.

The fourth embodiment is effective to remove an image signal, while achieving the same effect as that of the first embodiment.

This embodiment may be arranged such that the RF amplifying circuits 3 to 3' are made in an integrated circuit by using GaAs MES FETs which are excellent in high frequency and anti-distortion characteristics and the RF gain control circuit 9, the mixer circuits 10 and 10', the wide-band shifter 30 and the phase shift and composer 12 are integrated in one IC. This arrangement is effective for obtaining an integrated front-end device which is excellent in high frequency and anti-distortion characteristics.

Figure 5:
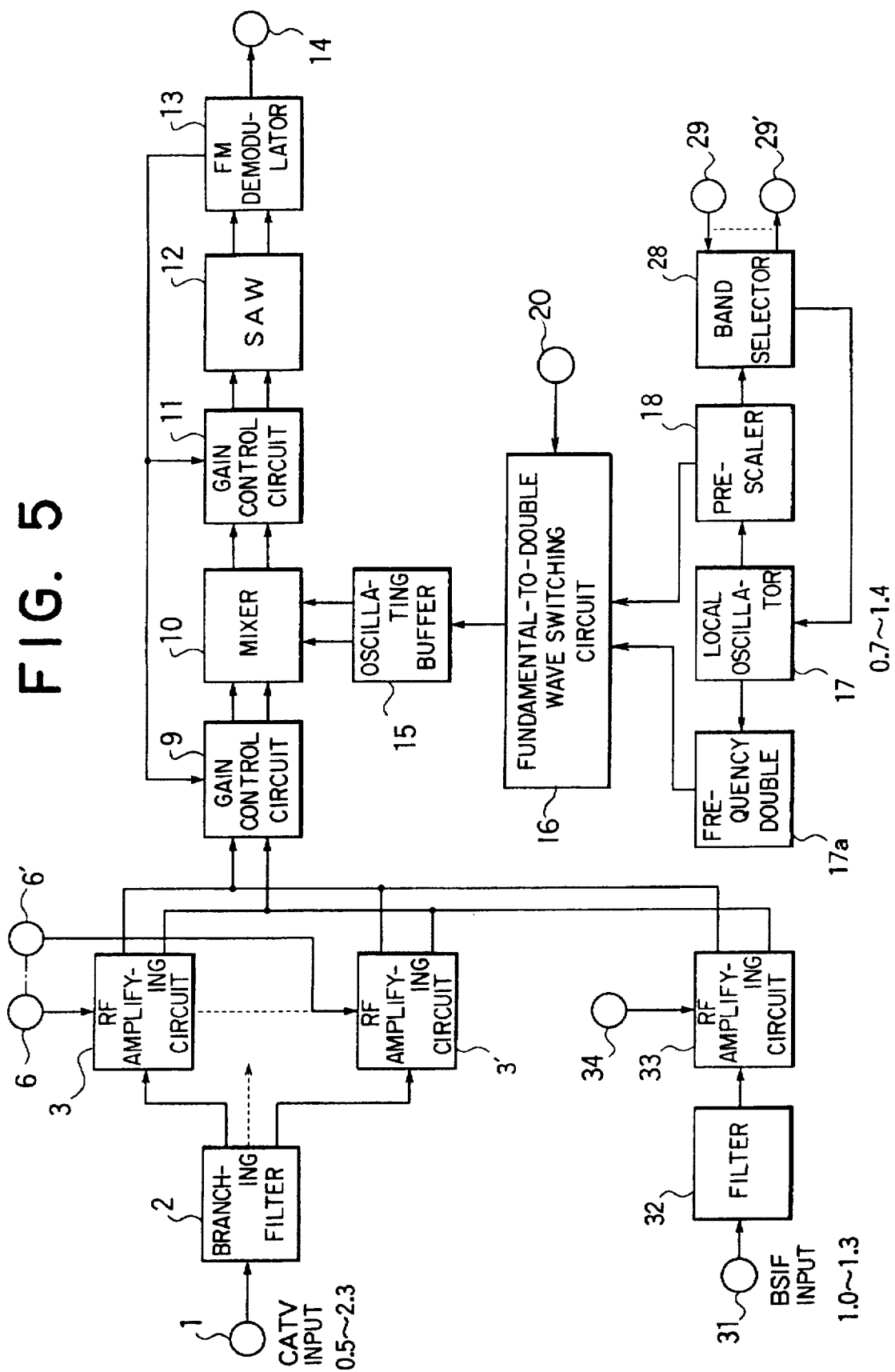
FIG. 5 is a block diagram showing a receiving apparatus according to a fifth embodiment of the present invention.

FIG. 5 is a block diagram showing a fifth embodiment of the present invention. This block diagram shows a receiving apparatus adapted to receive the signals sent from a CATV system such as an optical image distributing system for transmitting a wide-band signal and a satellite broadcasting system.

As shown, a wide-band RF signal (for example, 0.5 to 2.3 GHz) is input at a terminal 1 and is branched into two or more bands through the branching filter 2. The band signals are input to the corresponding RF amplifying circuits 3 to 3'.

An intermediate-frequency (IF) signal (for example, 1 to 1.3 GHz) sent from the broadcasting satellite is input to the RF amplifying circuit 33 through the band-pass filter 32. One of the RF amplifying circuits 3 to 3' and 33 is selected in response to an active one of the channel selecting signals applied to the terminals 6 to 6' and 34. It means that the other RF amplifying circuits are not selected. Hence, one band is selected from a plurality of output bands of the branching filter 2 and the BSIF band. Assuming that the branching filter 2 has three outputs, the three output band widths are set to 0.4 to 1.2, 1.1 to 1.8 and 1.6 to 2.4 GHz. The superfluous waves such as an image signal are sufficiently suppressed through the branching filter. One of the RF amplifying circuits 3 to 3' and 33 supplies a differential output to the RF gain control circuit 9. The signal whose gain is controlled by the RF gain control circuit 0 is mixed with the oscillating signal supplied from the oscillating buffer 15 in the mixer circuit 10. Then, the mixer circuit 10 serves to output an intermediate-frequency (IF) signal (for example, 402 MHz).

In this embodiment, assuming that the oscillating frequency of the local oscillator 17 is 0.7 to 1.4 GHz, when the input RF signal has a frequency in a range of 0.5 to 1.0 GHz, the fundamental wave is used. When the input RF signal containing the intermediate-frequency signal sent from the broadcasting satellite has a frequency in a range of 1.0 to 2.3 GHz, the double frequency wave (1.4 to 2.8 GH) is used. Specifically, a fundamental-to-double wave switching circuit 16 is located next to the local oscillator 17 and actuates by the switching signal applied at the terminal 20 like the first embodiment. The fundamental wave or double frequency wave is sent from the switching circuit 16 to the mixer circuit 10 through the oscillating buffer 15.

In place of the foregoing arrangement, it is possible to use one of the fundamental wave and the half frequency wave indicated in the second embodiment or one of fundamental wave, the double frequency wave and the half frequency wave indicated in the third embodiment.

The oscillating signal is sent from the oscillating circuit 17 to a pre-scaler 18 in which the signal is frequency-divided. The frequency-divided signal is input to a band selector 28. A band-selecting signal is applied from terminals 29. The band selector 28 produces a signal indicative of the phase difference between the frequency-divided signal and the fundamental wave divided according to the band-selecting signal to the local oscillator 17. By the band-selecting signal, the local oscillator 17 is controlled.

Next, the intermediate-frequency (IF) signal output from the mixer circuit 10 is amplified by the IF gain control circuit 11. The frequency band of the amplified signal is limited by the SAW filter 12. The band-limited signal is FM-demodulated by the FM demodulator 13. Then, the demodulated signal is output at a terminal 14 as a base-band signal. Based on the output of the FM demodulator 13, the gains of the RF gain control circuit 9 and the IF gain control circuit 11 are controlled so that the output level of the demodulator is kept at a predetermined level.

The fifth embodiment is effective to receive either of a signal from a wide-band optical image distributing system and a signal from a broadcasting satellite by one receiver and also to provide a small-sized and high-performance receiver, because the components other than the RF input circuit (the input filter and the RF amplifying circuits) are commonly used for the distributing system and the BS system.

Figure 6:
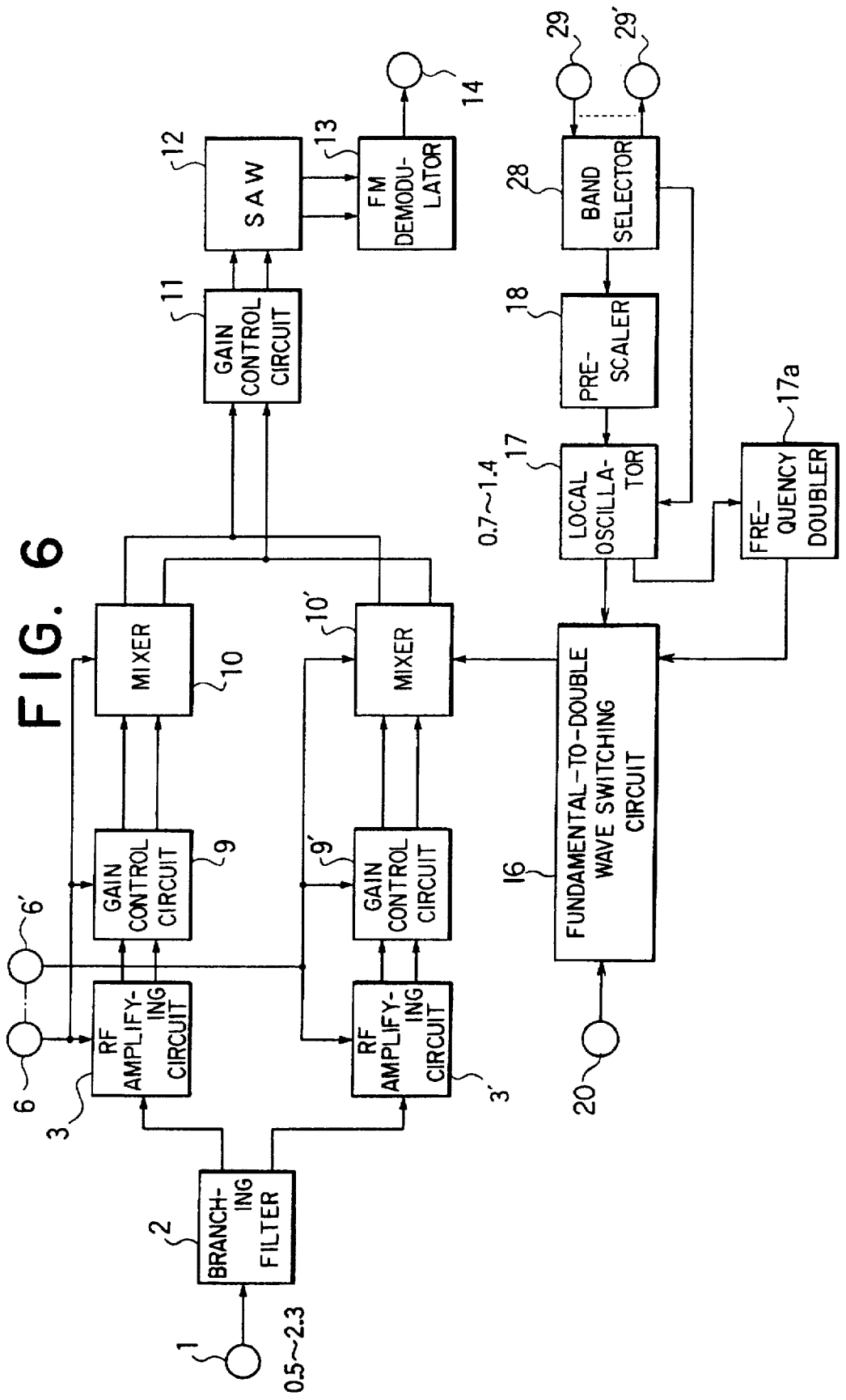
FIG. 6 is a block diagram showing a receiving apparatus according to a sixth embodiment of the present invention.

FIG. 6 is a block diagram showing a receiving apparatus according to the sixth embodiment of the present invention.

The feature of this embodiment is that the wide-band RF signal (for example, 0.5 to 2.3 GHz) input at the terminal 1 is branched into two bands through the branching filter 2 and each band signal is input to one of two series, each including an RF amplifying circuit 3 or 3', a gain control circuit 9 or 9' and a mixer 10 or 10'. One of the two series is selected in response to an active one of the channel selecting signals input at the terminals 6 to 6'. The other circuits are made inoperative. It means that one band is selected from the two or more output bands of the branching filter 2.

The mixers 10, 10' serve to mix the received signal with the oscillating signal supplied from an a switching circuit 16 for producing an intermediate-frequency (IF) signal of, for example, 402-MHz signal. Preferably, the local oscillator 17 should have an oscillating frequency range of 0.7 to 1.4 GHz. The operations of the components following the mixers 10, 10' are the same as those in the foregoing embodiments and hence the explanation thereof will be omitted.

This embodiment achieves the same effect as the first through third embodiments.

This embodiment may be arranged such that the RF amplifying circuits 3 to 3' are made in a integrated circuit by using GaAs MES FETs which are excellent in high frequency and anti-distortion characteristics and the RF gain control circuits 9, 9', the mixers 10, 10', the oscillating buffer 15, the fundamental-to-double wave switching circuit 16, and the IF gain control circuit 11 are integrated in one IC. This arrangement is effective for obtaining an integrated front-end device which is excellent in high frequency and anti-distortion characteristics.

Figure 7:
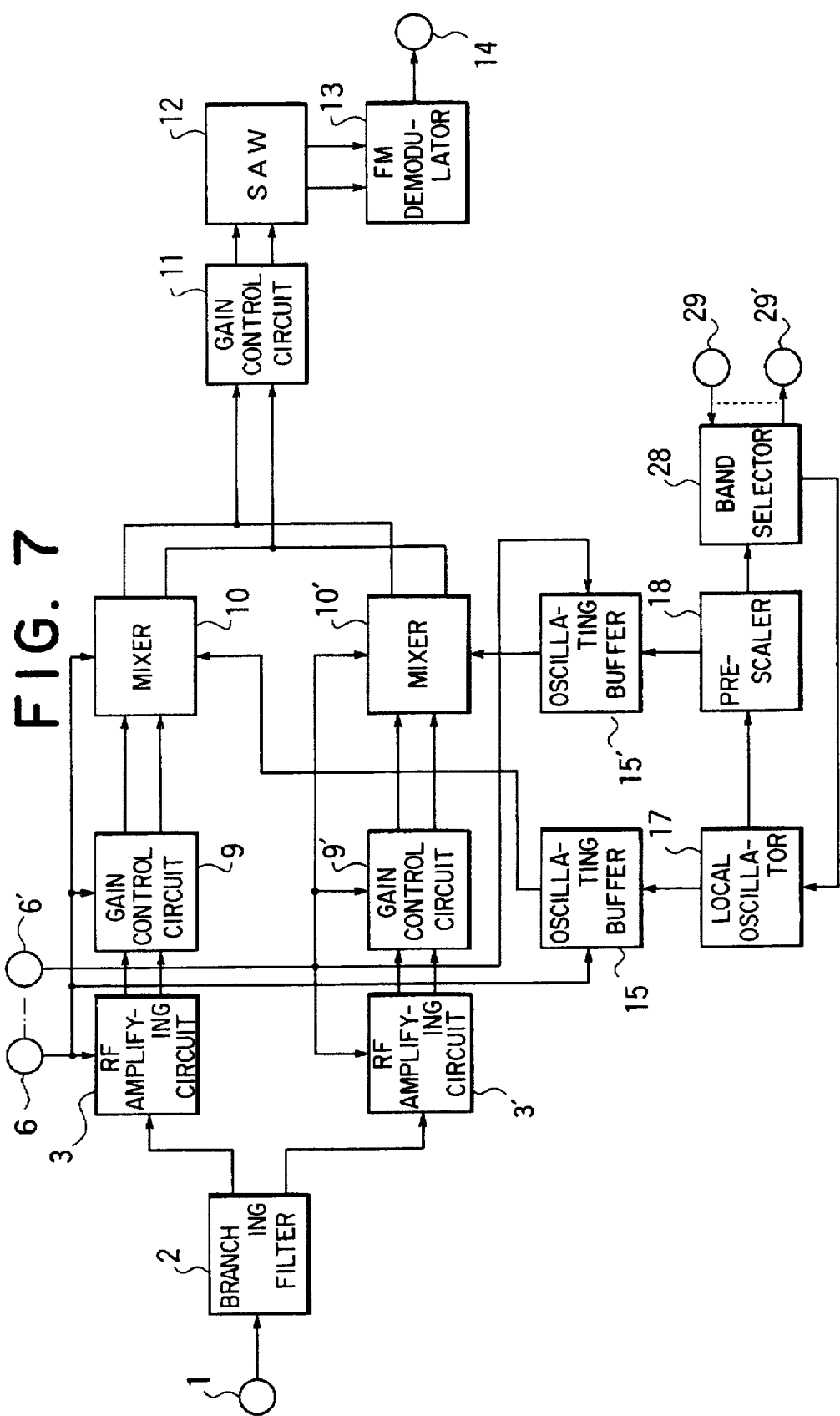
FIG. 7 is a block diagram showing a receiving apparatus according to a seventh embodiment of the present invention.

FIG. 7 is a block diagram showing a receiving apparatus according to a seventh embodiment of the present invention.

The feature of this embodiment is that the oscillating frequency range of the local oscillator 17 is set to 1.4 to 2.8 GHz in place of the oscillating frequency range of the sixth embodiment, the fundamental wave is applied to the mixer 10 and the half-frequency wave is applied to the mixer 10'.

The operation of the seventh embodiment is the same as that of the foregoing embodiments and hence will not be described.

This seventh embodiment achieves the same effect as the first to the third and the sixth embodiments.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A wide-band receiving apparatus, comprising:

means for receiving a wide-band input signal containing modified RF signals of two or more different frequency bands and separating said RF signals by the bands;

means for selecting one of said separated RF signals;

a variable frequency local oscillating circuit for generating a first oscillating signal of a selected variable fundamental frequency;

frequency converting means for converting the fundamental frequency of said first ocillating signal into at least one second oscillating signal of a frequency having a predetermined ratio to said selected variable fundamental frequency;

a band-selector circuit for controlling the fundamental frequency of said oscillating signal based on a comparison of a frequency relating to the frequency of said second oscillating signal with a frequency relating to the frequency band of the selected RF signal;

second selecting means for selecting one of said first oscillating signal and said at least one second oscillating signal based on the frequency band of said selected RF signal;

means for changing a phase of said oscillating signal selected by said second selecting means thereby producing third and fourth oscillating signals having phases shifted 90 with respect to each other;

a first mixer circuit for mixing said selected RF signal with said third oscillating signal to produce a first intermediate-frequency signal;

a second mixer circuit for mixing said selected RF signal with said fourth oscillating signal to produce a second intermediate-frequency signal;

means for composing said first and second intermediate-frequency signals together, with a phase difference of 90 between said first and second intermediate-frequency signals thereby generating a composed output; and a circuit for demodulating said composed output.

* * * * *

UNITED STATES PATENT AND TRADEMARK OFFICE
CERTIFICATE OF CORRECTION

PATENT NO. : 5,630,214
DATED : May 13, 1997
INVENTOR(S) : Yamamoto, et al.

It is certified that error appears in the above-indentified patent and that said Letters Patent is hereby corrected as shown below:

On the cover page: Item[30]  insert --Foreign Application Priority Data: May 13, 1991 [JP] Japan........3-135390--.

Signed and Sealed this

Sixteenth Day of September, 1997

Attest:

BRUCE LEHMAN

Attesting Officer

Commissioner of Patents and Trademarks